US00RE38674E

(19) United States
(12) Reissued Patent
Chau et al.

(10) Patent Number: US RE38,674 E
(45) **Date of Reissued Patent: *Dec. 21, 2004**

(54) PROCESS FOR FORMING A THIN OXIDE LAYER

(75) Inventors: Robert S. K. Chau, Beaverton, OR (US); William L. Hargrove, Sherwood, OR (US); Leopoldo D. Yau, Portland, OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

(21) Appl. No.: 08/528,188

(22) Filed: Sep. 14, 1995

Related U.S. Patent Documents

Reissue of:
(64) Patent No.: 5,244,843
Issued: Sep. 14, 1993
Appl. No.: 07/809,971
Filed: Dec. 17, 1991

(51) Int. Cl.[7] ..... H01L 21/31; H01L 21/469
(52) U.S. Cl. ..... 438/773; 438/774; 438/762; 438/297; 438/287; 438/452; 148/DIG. 118; 257/E21.193; 257/E21.285
(58) Field of Search ..... 437/239, 983, 437/244, 946, 978; 148/DIG. 117, DIG. 118, DIG. 13, DIG. 43; 438/762, 763, 770–774

(56) References Cited

U.S. PATENT DOCUMENTS

| | | | | |
|---|---|---|---|---|
| 3,556,879 A | | 1/1971 | Mayer | |
| 4,159,917 A | | 7/1979 | Gluck | |
| 4,231,809 A | | 11/1980 | Schmidt | |
| 4,344,985 A | * | 8/1982 | Goodman et al. | 427/85 |
| 4,551,910 A | * | 11/1985 | Patterson | 29/576 |
| 4,906,595 A | * | 3/1990 | van der Plas et al. | 437/239 |
| 4,994,894 A | * | 2/1991 | Nakayama | 357/71 |
| 5,028,560 A | | 7/1991 | Tsukamoto et al. | |
| 5,057,463 A | * | 10/1991 | Bryant et al. | |
| 5,174,881 A | | 12/1992 | Iwasaki et al. | |

FOREIGN PATENT DOCUMENTS

| | | | | |
|---|---|---|---|---|
| GB | 2172746 | * | 9/1981 | 437/244 |
| JP | 62-235740 A | * | 10/1987 | 437/239 |
| JP | 3147369 | * | 6/1991 | 437/983 |

OTHER PUBLICATIONS

Wolf et al., "Silicon Processing for the VLSI Era vol. 1: Process Technology", Lattice Press, pp. 215–216, 1986.*

(List continued on next page.)

*Primary Examiner*—Richard Booth
(74) *Attorney, Agent, or Firm*—Blakely, Sokoloff, Taylor & Zafman LLP

(57) ABSTRACT

A novel process for forming a robust, sub-100 Å oxide is disclosed. Native oxide growth is tightly controlled by flowing pure nitrogen during wafer push and nitrogen with a small amount of oxygen during temperature ramp and stabilization. First, a dry oxidation is performed in oxygen and 13% trichloroethane. Next, a wet oxidation in pyrogenic steam is performed to produce a total oxide thickness of approximately 80 Å. The oxide layer formed is ideally suited for use as a high integrity gate oxide below 100 Å. The invention is particularly useful in devices with advanced, recessed field isolation where sharp silicon edges are difficult to oxidize. For an oxide layer of more than 100 Å, a composite oxide stack is used which comprises 40–90 Å of pad oxide formed using the above novel process, and 60–200 Å of deposited oxide.

44 Claims, 5 Drawing Sheets

OTHER PUBLICATIONS

Kanigaki, Y.; "Thermal Oxidation . . . by Nitrogen"; Appl. Phys.; vol. 48, No. 7, Jul. 1977; pp. 2891–2896.*

Montillo, F.; "High Temperature Annealing . . . Surfaces"; J. Electrochem. Soc., vol. 188, No. 9, Sep. 1971; pp. 1463–1468.*

Gdula, R.; "Composite Dielectric Layer"; IBM Tech. Disc. Bull., vol. 14, No. 9, Feb. 1972; p. 2609.*

Deal, B.; "The Oxidation . . . and Steam"; J. Electochem Society; vol. 110, No. 6, Jun. 1968; pp. 527–533.*

S. Wolf and R.N. Tauber; "Silicon Processing For The VLSI Era"; vol. 1, Chapter 7, 1986; pp. 215–216.*

S. Wolf; "Silicon Processing For The VLSI Era"; vol. 2, Chapter 2, 1990.*

F. Bryant and F. Liou; "Thin Gate Oxides Grown in Argon Diluted Oxygen With Steam and HCL Treatment"; Proceedings Of The Symposium On Silicon Nitride and Silicon Dioxide Thin Insulating Films; vol. 89–7, 1989; pp. 220–228.*

M.B. Das, J. Stach, and R.E. Tressler; "A Comparison Of HCl–And Trichloroethylene–Grown Oxides On Silicon"; Journal Of The Electrochemical Society: Solid–State Science and Technology; vol. 131, No. 2, (Feb. 1984); pp. 389–392.*

B.Y. Liu and Y.C. Cheng; "Growth and Characterization Of Thin Gate Oxides By Dual TCE Process"; Journal Of The Electrochemical Society–Accelerated Brief Communication; vol. 131, No. 3, (Mar. 1984); pp. 683–686.*

Y.C. Cheng and B.Y. Liu; "Oxidation Characteristics And Electrical Properties Of Low Pressure Dual TCE Oxides"; Journal Of The Electrochemical Society: Solid–State Science and Technology; vol. 131, No. 2, (Feb. 1984); pp. 354–358.*

R.G. Cosway and C.E. Wu; Comparison Of Thin Thermal $SiO_2$ Grown Using HCl and 1,1,1 Trichloroethane (TCA); Journal Of The Electrochemical Society; Solid–State Science and Technology; vol. 132, No. 1, (Jan. 1985); pp. 151–154.*

C. Wei, Y. Nissan–Cohen, and H. Woodbury; "Evaluation of 850° C. Wet Oxideee As The Gate Dielectric In A 0.8 $\mu$m CMOS Process"; IEEE Transactions On Electron Devices; vol. 38, No. 11 (Nov. 1991); pp. 2433–2441.*

Ghandhi, "VLSI Fabrication Principles", 1983, pp. 385–388, John Wiley and Sons, 1983.*

Wolf et al., "Silicon Processing for the VLSI Era, vol. 1: Process Technology", pp. 201–207, Lattice Press, 1986.*

* cited by examiner

PROCESS FOR FORMING A THIN OXIDE LAYER

Matter enclosed in heavy brackets [ ] appears in the original patent but forms no part of this reissue specification; matter printed in italics indicates the additions made by reissue.

BACKGROUND OF THE INVENTION

1. Field of the Invention

This invention relates to the field of semiconductor devices and more particularly to a method for forming a thin, high integrity, silicon dioxide layer. The thin $SiO_2$ layers formed by the present invention are ideal for use as a gate oxide.

2. Prior Art

In the semiconductor industry, silicon dioxide ($SiO_2$) films are used in a variety of applications. Often they are used as a dielectric or insulative layer to separate electrically various regions or structures. Examples of use as an insulative layer include as a gate oxide, as an interlevel dielectric between metal 1 and metal 2, and as field isolation. $SiO_2$ is also used for scratch protection and passivation purposes.

When used as a gate oxide on an MOS device, the $SiO_2$ layer is disposed above the source, drain, and channel regions of the silicon substrate, with the gate of the device formed on the $SiO_2$ layer. The gate oxide thus electrically insulates the gate from the source and drain.

When used as a field isolation, a field oxide is formed to insulate electrically one device, for example a transistor, from another. Traditionally local oxidation of silicon (LOCOS) is used to form the field isolation. Active regions of the silicon substrate are covered with a mask such as silicon nitride, while the field regions remain exposed to an oxidizing ambient to form the field oxide. Recently, advanced isolation techniques are being used on MOS devices in place of LOCOS technology. Various recessed isolation technologies are used to improve device performance. For example, the recessed sealed sidewall oxidation technique (RESSFOX). In this technique, what will become the field regions are first etched while the device areas of the substrate remain covered. The side walls of the recessed regions are also covered with the same masking material as the device regions, commonly silicon nitride with an underlying thermal pad oxide. The advanced isolation techniques offer less lateral encroachment of the field oxide into the active regions (commonly known as the bird's beak) as well as a more planar surface than conventional LOCOS technologies. One drawback of these advanced techniques is that sharper edges are formed on the substrate surface. These sharp edges are more difficult to oxidize in the later oxidation step for forming the gate oxide. An additional problem with many of the recessed technologies is the requirement of a silicon etch in the field oxide region prior to field oxide growth. The silicon etch creates contamination which remains on the wafer during subsequent steps. Thus, contamination from the silicon etch may lead to defects in the subsequently grown gate oxide. For an in-depth discussion of conventional and advanced isolation techniques, see Silicon Processing For The VLSI Era, by Stanley Wolf, Volume 2, Chapter 2, pp 12–83 (Lattice Press 1990).

$SiO_2$ can be deposited by such techniques as sputter deposition or chemical vapor deposition (CVD) directly on the substrate. $SiO_2$ can also be grown by oxidizing exposed silicon. $SiO_2$ can be grown in a "dry" process utilizing oxygen ($O_2$), or in a "wet" process using steam as the oxidizing agent. Gate oxides are typically grown as opposed to deposited.

Because $SiO_2$ layers electrically isolate active device regions, the integrity of the oxide film has a large impact on device performance. Also, the scaling of device dimensions to enhance circuit density and speed performance requires the scaling of oxide thickness. For example, a 5.0 v, 0.8$\mu$ technology requires an oxide thickness of about 150 Å for high performance, while a 3.3 V, 0.5$\mu$ technology requires an oxide thickness of approximately 70–80 Å for high performance. Therefore, the ability to form a high quality, low defect $SiO_2$ film has become increasingly important. Such thin gate oxides are particularly important for devices with RESSFOX isolation. In RESSFOX devices, the minimization of bird's beak encroachment into the active regions has allowed for scaling of device dimensions. Also, the planar surface of these devices allows for higher resolution lithography. Because of the scaling of device dimensions achievable with RESSFOX, a thin gate oxide is necessary. One measurement of the quality of an $SiO_2$ film is the current density it can withstand without breakdown, known as Jt or change-to-breakdown. Generally, an $SiO_2$ film used as the gate oxide must be able to withstand a ramp Jt of 1 Coulomb per square centimeter (1 $C/cm^2$) or greater when measured on large area MOS capacitors (e.g. area=0.0695 $cm^2$).

In any $SiO_2$ growth or deposition, process contamination can lead to unacceptable $SiO_2$ layers. The contamination can be in the form of particulate matter or ionic contamination such as sodium ions (Na+). While a wet process is generally more successful in oxidizing the sharp edges of features such as those which occur on devices with advanced isolation technologies, wet processes generally exhibit a higher defect density than dry oxidation processes. Often, to reduce defects in the film, a small amount of chlorine is included along with the oxidizing agent in order to clean up the surface and reduce the defect density of the grown film. The chlorine is usually added to a dry oxidation step since many chlorine containing compounds do not reach in steam to form Cl, the necessary species for wafer cleaning. Usually, the chlorine concentration is limited to about 1% to 3% of the total gas volume in the oxidizing mixture, because excess chlorine may become entrapped in the oxide, making it more susceptible to high-field hot electron damage and, therefore, less reliable. A process for growing a gate oxide of 175 Å using dry, dilute oxygen oxidation, a steam with chlorine ($Cl_2$) oxidation, and a final dry dilute oxygen oxidation is described in F. Bryant and F.T. Liou, Proc. Electrochemical Soc. Volume 89-7, pp. 220–228 (1998). The process and properties of a 175 Å steam oxide (without chlorine) is described in C. Y. Wei, Y. Nissan-Cohen, and H.H. Woodbury, IEEE Trans Electron Devices, Volume 38, No. 11, November 1991, pp. 2433–2441. Other processes for growing oxides using chlorine or chlorine containing compounds such as anhydrous hydrogen chloride (HCl), trichloroethylene (TCE), and trichloroethane (TCA) are described in Silicon Processing For The VLSI Era, Volume 1, Chapter 7, pp 215–216.

What is needed is a process for growing a high integrity oxide film. The oxide film should exhibit reduced defects and effective oxidation of sharp edges, allowing for high reliability of devices fabricated utilizing advanced isolation techniques. It is further desirable that the oxide formed be sufficiently robust to allow for thin oxide layers for use as a gate oxide in sub-micron VLSI applications.

SUMMARY OF THE INVENTION

A process for fabricating a high integrity silicon dioxide layer is described. The oxide formed can be used as a sub-100 Å gate oxide. Since the oxide shows low defects and effectively oxidizes sharp silicon corners or features, it is particularly well suited for use on devices with advanced isolation technologies utilizing recessed field oxides.

First, during wafer push, pure nitrogen is flowed over the substrate to limit native oxide growth. During temperature ramp and stabilization, 1% oxygen in nitrogen flows through the furnace to form a tightly controlled native oxide layer of approximately 5–10 Å.

Next, two low temperature oxidation steps are performed to grow the oxide layer. First, a dry oxidation in 13% trichloroethane (TCA) is performed. In this step, the high concentration of TCA cleans up the surface allowing for a low defect oxide layer. During this step, the silicon surface is protected by the native oxide grown during temperature ramp and stabilization.

Then, a wet oxidation in pyrogenic steam is performed. This oxidation is efficient in oxidizing the sharp features associated with recessed field oxides. It also depletes the chlorine (which is incorporated in the oxide during the 13% TCA dry oxidation) so that the final oxide is essentially chlorine-free.

After a final stabilization and temperature ramp down in a pure $N_2$ flow, the wafers are pulled from the furnace. In the currently preferred embodiment, the total thickness of the oxide layer is 60–80 Å.

In another embodiment, for oxides thicker than 100 Å, 40 Å–90 Å of the novel oxide as described above is grown. A deposited oxide is then added to make up the final thickness of more than 100 Å. The combination oxide stack, known as composite oxide, gives much lower defect density than a standard chlorinated thermal oxide for thicknesses over 100 Å.

DETAILED DESCRIPTION OF THE PREFERRED EMBODIMENT

A process for fabricating a high integrity, silicon dioxide ($SiO_2$) layer is described. In the following description, numerous specific details are set forth such as specific thicknesses, temperatures, times, gas mixtures, etc. in order to provide a thorough understanding of the present invention. It will be obvious, however, to one skilled in the art that these specific details need not be employed to practice the present invention. In other instances, well known processing steps are not described in detail in order not to obscure unnecessarily the present invention. Additionally, although in the description below the fabrication of the $SiO_2$ layer of the present invention is illustrated in conjunction with its use as a gate oxide or as part of the gate oxide, it will be appreciated that the method can be used to form an $SiO_2$ film or part of an $SiO_2$ film in any application where a low defect $SiO_2$ film is required, such as for use as a tunnel oxide. Also, although the present invention is illustrated with use of a device using an advanced isolation technique known as recessed sealed sidewall field oxidation (RESSFOX), it will be understood that the present invention is applicable to devices using any type of insulation, such as conventional LOCOS technology. Finally, while the invention is shown as applied to the fabrication of an NMOS device, the invention can also be practiced on, for example, PMOS, CMOS, Bi-MOS, and Bi-CMOS devices.

Figure 1:
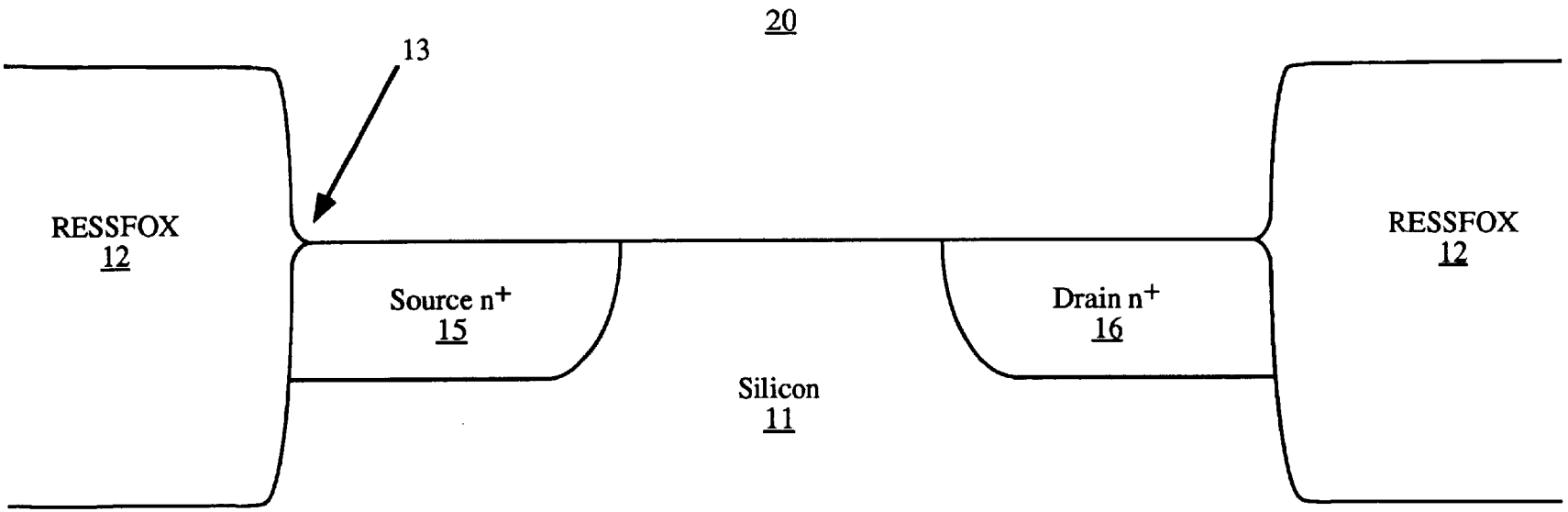
FIGURE 1 (Prior Art)
FIG. 1 is a cross-sectional elevation view of a semiconductor device with advanced isolation upon which the present invention is practiced.
Figure 4:
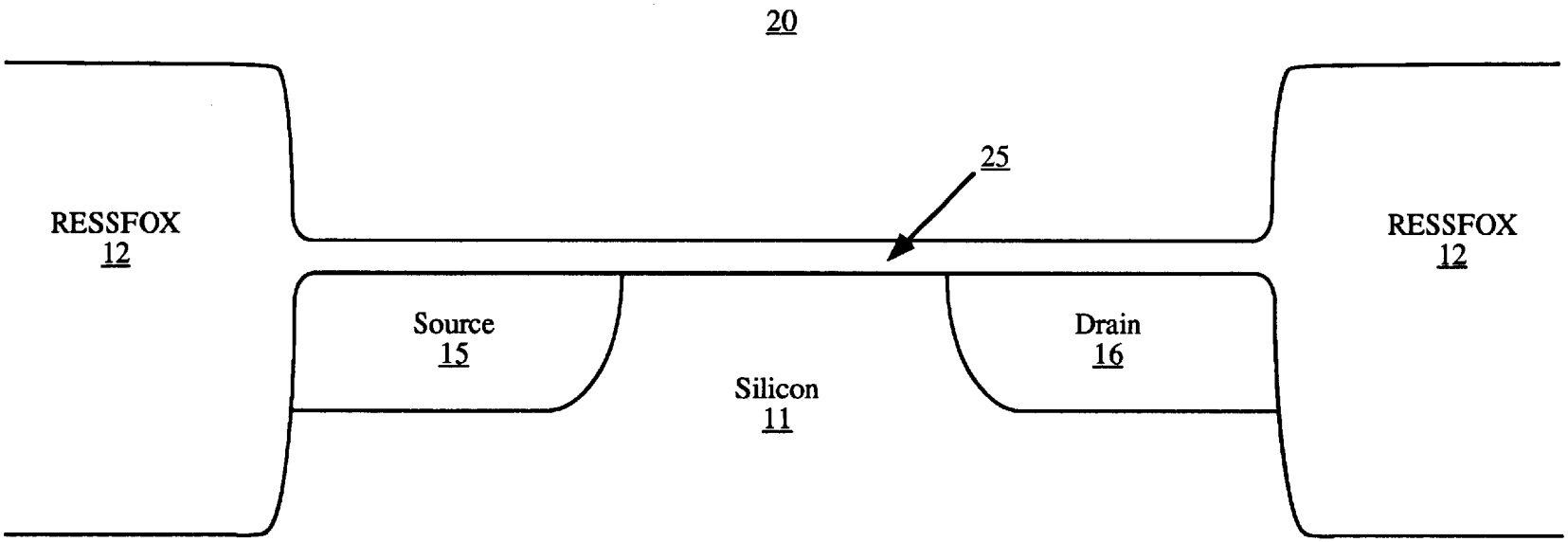
FIG. 4 is a cross-sectional elevation view of the structure of FIG. 1 after the present invention has been practiced thereon.
Figure 5:
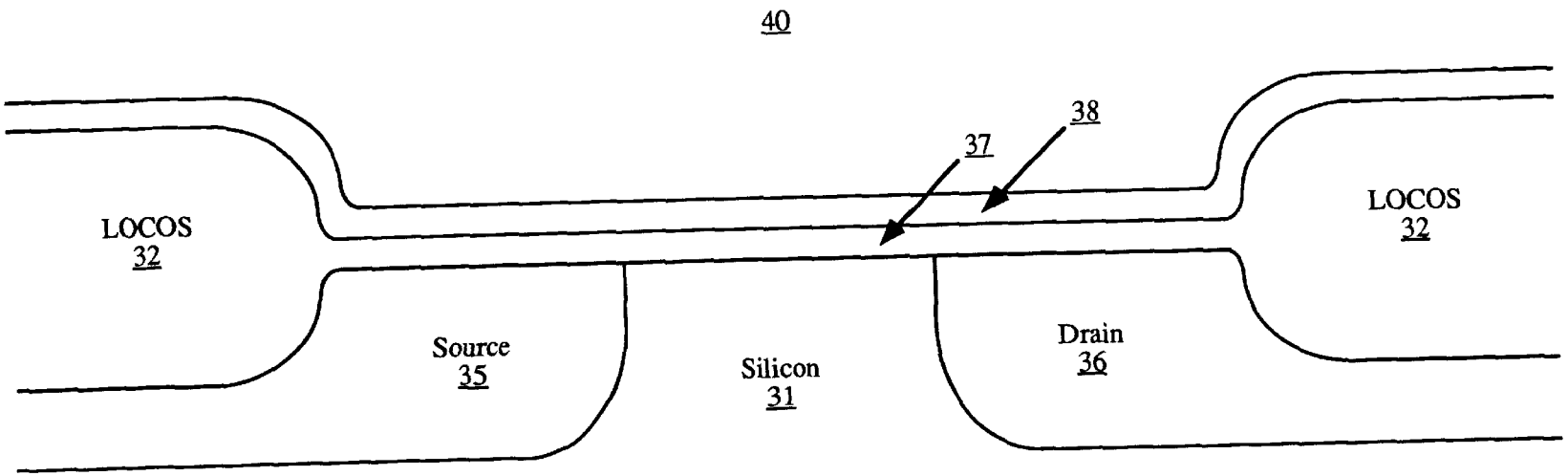
FIG. 5 is an MOS device with conventional field isolation after the present invention has been practiced thereon and after a deposited oxide has been formed thereon.

Referring to FIG. 1, field oxide 12, source 15, and drain 16 are shown on p-type silicon substrate 11 during fabrication. The structure of FIG. 1 can be made by methods well known in the art . As is well known in the art, source 15 and drain 16 are preferably formed later in the processing sequence in a self aligned process. Source 15 and drain 16 will generally be formed after formation of the gate oxide and gate electrode by first performing a low dose implant to form lightly doped regions next to the active regions. This implant is self aligned since the gate electrode masks the regions of substrate 11 directly underneath the gate, while the field oxide masks the inactive regions. After sidewall spacers are formed, a high dose implant is performed to complete the source and drain formation. Source and drain regions are shown in FIGS. 1, 4 and 5 to illustrate better the general location where the present invention is practiced in the currently preferred embodiment. Region 20 indicates the general region where the $SiO_2$ layer of the present invention will be grown. Field oxide 12 is a recessed sealed sidewall field oxide. In the currently preferred embodiment, the total thickness of field oxide 12 is 4000 Å. Field oxide 12 extends approximately 400 Å above the nonoxidized portion of silicon substrate 11.

In the currently preferred embodiment of the present invention, the oxide growth process is carried out in a Thermco Model 10,000 horizontal furnace. A schematic of such a system is shown in FIG. 2.

Figure 2:
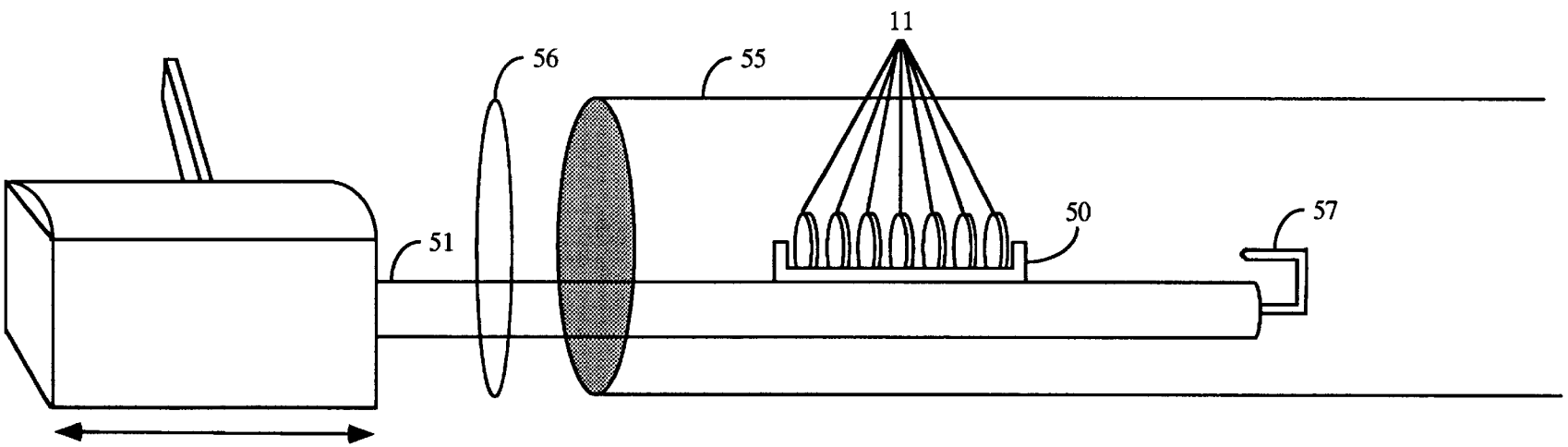
FIG. 2 is a schematic representation of the furnace in which the present invention is practiced.

Referring to FIG. 2, several silicon substrates 11 at the stage of processing shown in FIG. 1 are shown loaded in quartz wafer boat 50. In the system used in the currently preferred embodiment, up to six wafer boats 50 holding twenty five silicon substrates 11 each can be processed at one time. The wafer boats 50 are held by the cantilevered rod 51. Rod 51 moves in a horizontal direction to load and unload the wafer boats 50 into and out of the furnace tube 55. During processing, loading and unloading, the rod 50 is fully suspended within the furnace tube 55. When the wafers are fully loaded, the tube is sealed by quartz plate 56.

In the following description, each step of the process is described in reference to the system shown in FIG. 2 as well as the process flow diagram of FIG. 3. At the beginning of processing, the rod 51 is fully to the left of the position shown in FIG. 2. At this point the wafer boats 50 are loaded on rod 51. This is shown as step 1 of FIG. 3.

After loading wafer boats 50 the silicon substrates 11 on rod 51, the oxide growth process is begun. At this stage in the processing, the silicon substrate in the region 20 is clean, exposed silicon. The second step of the process is referred to as the "wafer push" and is shown as step 2 of FIG. 3. During this step, the substrates 11 are pushed into the furnace as rod 51 moves to the right. At the beginning of the push, the furnace temperature, i.e. the temperature inside tube 55, is at approximately 600° C. in the currently preferred embodiment.

During the push, the furnace temperature is ramped from 600° to 700° C. in the currently preferred embodiment. Also during the push, pure nitrogen ($N_2$) from nozzle 57 of FIG. 2 is flowed over the wafers at approximately 15 standard liters per minute (SLPM) in the currently preferred embodiment. This flow of nitrogen has the effect of limiting native oxide growth during the push, allowing for tighter control of the thickness of the grown oxide. Step 2 takes approximately 10 minutes to complete.

After the wafers are all the way in tube 55 and quartz plate 56 has sealed the end of tube 55, the temperature is ramped for approximately 700°–800° C. in the currently preferred embodiment. This is shown as step 3 in FIG. 3. During this step, oxygen ($O_2$) is flowed in addition to $N_2$. In the currently, preferred embodiment, approximately 1% oxygen in nitrogen by volume flows during this step. Approximately 15 SLPM of $N_2$ and 150 standard cubic centimeters per minute (SCCM) of $O_2$ flow in the currently preferred embodiment. The temperature ramp step 3 takes approximately 15 minutes in the currently preferred embodiment.

Figure 3:
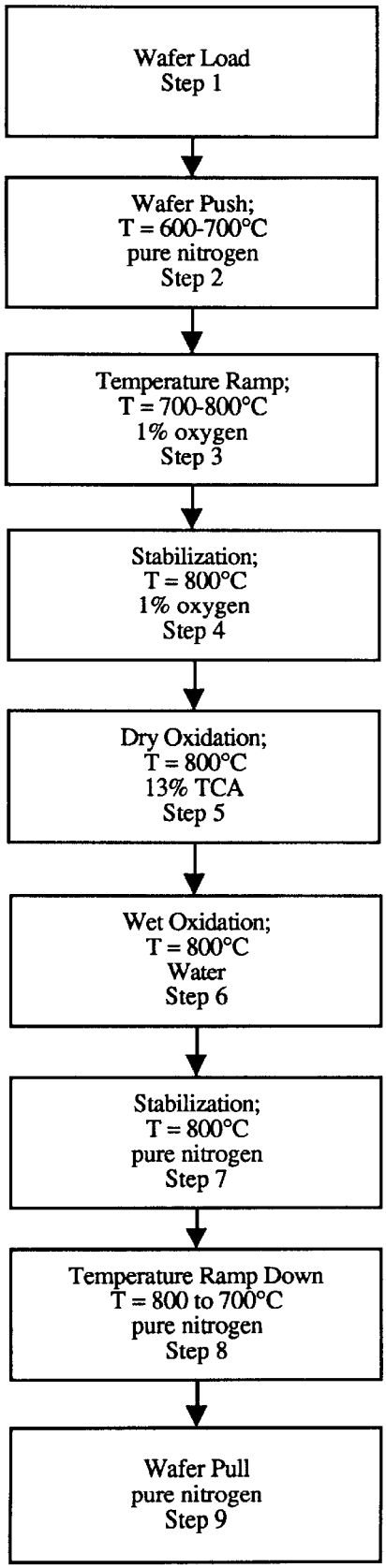
FIG. 3 is a block diagram of the process of the present invention.

Following step 3 is a stabilization step, shown as step 4 in FIG. 3. During this step, the temperature is held constant at approximately 800° C. while approximately 1% oxygen in nitrogen flows through the tube 55 of FIG. 2. The stabilization step 4 takes about 10 minutes. During the first four steps, a native oxide of approximately 5–10 Å grows on the wafers. The thickness of the native oxide is well controlled due to the nitrogen flowed during wafer push, which prevents excessive native oxide growth from reaction with atmospheric oxygen during the wafer push step 2, and by the relatively small oxygen flow during steps 3 and 4. The ability to grow a thin yet uniform native oxide film is important because this thin film protects what would otherwise be a bare silicon surface from chlorine attack during subsequent steps. Conversely, if this film weren't controlled by the $N_2$ flow during push and temperature ramp and stabilization, a thicker and less uniform native oxide film would grow leading to a thicker film than desired, as well as not allowing for acceptable process control of the final film thickness.

Next, two low temperature oxidation steps (LTO) are performed. Although high temperature oxidation steps could be used (e.g. temperatures in the range of approximately 900°–1100° C.), we have found the present invention forms a robust oxide when using the temperatures specified below. This ability to form high quality, low defect oxide films without a high temperature oxidation is helpful for keeping a process within its "thermal budget". That is, in keeping high temperature steps to a minimum, greater control over junction depths and diffusion profiles can be maintained. Step 5 of FIG. 3 is a dry oxidation step. During this step, the temperature of tube 55 remains at approximately 800° C. During this step, trichloroethane (TCA, chemical formula: $C_2H_3Cl_3$) is introduced into tube 55 by bubbling $N_2$ through liquid TCA. In the currently preferred embodiment, $N_2$ flows at a rate of approximately 3000 SCCM. Also in the currently preferred embodiment, oxygen flows at a rate of approximately 11 SLPM. The concentration of TCA in tube 55 under these conditions is approximately 13%, while the concentration of $O_2$ is approximately 79%. Also in the currently preferred embodiment, this step lasts for approximately 10 minutes and results in approximately 35 Å of oxide growth. The 13% TCA results in approximately 13% of the total gas volume being $Cl_2$, as a result of the reactions between TCA and $O_2$ to form HCl, and then HCl and $O_2$ to form $Cl_2$. This a much higher concentration of $Cl_2$ than what is typically encountered in prior art processes. As mentioned previously, the thin native oxide formed in steps 2–4 will protect the silicon surface of substrate 11 from $Cl_2$ attack. Additionally, since step 6, discussed below, is a wet process, any $Cl_2$ from step 5 which is trapped in the oxide film will be removed by the $H_2O$ in the wet oxidation step. Although the currently preferred embodiment uses 13% TCA, it is anticipated that TCA above approximately 9% will achieve the cleaning effect of the present invention. This cleaning effect of $Cl_2$ is an important aspect of the present invention in forming a high quality, low defect $SiO_2$ layer. It is particularly helpful when used in a device with a field isolation such as RESSFOX since the required silicon etch to form the recessed isolation produces a significant amount of contamination, which the $Cl_2$ removes in the present invention. It will also be appreciated that steps 2–4 could be omitted if substrate attack by chlorine and chlorine entrapment in the oxide film is not a problem.

Step 6 is a wet (pyrogenic steam) oxidation step. During this step, the substrates 11 are subjected to $H_2O$ formed by torching $O_2$ and $H_2$. During this step, $O_2$ flows at a rate of approximately 5 SLPM and $H_2$ flows at a rate of approximately 2 SLPM in the currently preferred embodiment. The temperature of the tube 55 of FIG. 2 remains at approximately 800° C. in the currently preferred embodiment during step 6.

Step 7 is a final stabilization step where the temperature remains at 800° C. for 30 minutes while pure $N_2$ is flowed at a rate of approximately 15 SLPM through tube 55. During this step, tube 55 is purged of any remaining steam from Step 6.

Step 8 is a temperature ramp down step. During this step, the temperature is decreased from 800° C. to 700° C. while pure $N_2$ flows through tube 55 at a rate of approximately 15 SLPM. Step 8 takes approximately 40 minutes in the currently preferred embodiment.

Finally, in step 9 of FIG. 3, the wafers are pulled from the furnace. During the wafer pull, pure $N_2$ continues to flow at a rate of 15 SLPM through nozzle 57.

Steps 1–9 of FIG. 3 are carried out sequentially in the currently preferred embodiment. Additionally, the furnace remains closed or sealed by quartz plate 56 from step 3 through step 8. It will be appreciated that not all of the above steps need to be performed in order to accomplish the objectives of the present invention. For example, the initial push (step 2) and temperature ramp (step 3) could be eliminated if $Cl_2$ attack of the silicon surface is not important and the thickness of the final oxide layer does not need to be precisely controlled. Additionally, the parameters such as times, temperatures, and gas flows can be modified while remaining within the spirit and scope of the invention. Additionally, any other source of chlorine, in addition to TCA can be used so long as the resultant $Cl_2$ concentration is above about 9%. Such other sources include pure chlorine gas ($Cl_2$), anhydrous hydrogen chloride (HCl), or trichloroethylene (TCE, chemical formula: $C_2HCl_3$).

FIG. 4 shows the structure of FIG. 1 after the process of the present invention has taken place. Gate oxide 25 is shown in the region 20 over source 15, substrate 11, and drain 16. In the currently preferred embodiment, gate oxide 25 is less than 100 Å and is preferably approximately 60–80 Å. Of the total thickness of gate oxide 25, approximately 5–10 Å is grown as a native oxide in steps 1–4 of FIG. 3, approximately 25–40 Å is grown in the dry oxidation step 5, and approximately 30–50 Å is grown in the wet oxidation step 6 in the currently preferred embodiment.

The gate oxide 25 formed by the present invention is an extremely robust oxide, showing increased device yield when compared against devices fabricated utilizing a gate oxide formed by, for example, a one step dry oxidation. The improved yield due to gate oxide 25 is particularly apparent when gate oxide 25 is used on edge intensive devices (that is devices on which the gate oxide must be grown on sharp edges) and on devices fabricated on the periphery of the silicon wafer. For example, the performance of edge intensive capacitors formed with an 80 Å gate oxide formed by a standard, prior art dry, 3% TCA oxidation and the performance 5 of those with an 80 Å gate oxide formed by the present invention was compared. The capacitor with a gate oxide formed by the present invention showed a pass rate of approximately 95% compared with a pass rate of 45% for the capacitors with the prior art gate oxide, using a pass criterion of Jt>1.0 $C/cm^2$ in a ramp Jt test. Various MOS devices with RESSFOX isolation and with a gate oxide formed by the present invention showed pass rates from approximately 97%–100%. In addition, this gate oxide 25 is much more robust against process induced contaminations than standard TCA dry oxide.

After formation of gate oxide 25, the polysilicon gate will be formed in the center of region 20 of FIG. 4, followed by other circuitry needed to complete the device.

In addition to its use to form a sub-100 Å gate oxide 25, the process of the present invention can be used to form a portion of a composite gate oxide for devices utilizing a thicker gate oxide than that used on the RESSFOX MOS device described above. In this application, the present invention will form a thermal "pad oxide". The thermal pad oxide is formed using the process as described above to form gate oxide 25.

Referring to FIG. 5, a typical MOS device with a LOCOS field oxide 32 is shown during fabrication on p-type silicon substrate 31. Shown in FIG. 5 are source 35 and drain 36. Also shown is pad oxide 37, formed by the process of the present invention as described above. The thickness of pad oxide 37 is approximately 75 Å in the currently preferred embodiment.

After formation of pad oxide 37, a second oxide layer 38 is deposited by a high temperature oxidation (HTO). The HTO deposition is accomplished by low pressure chemical vapor deposition (LPCVD) using nitrous oxide ($N_2O$) and dichlorosilane ($SiH_2Cl_2$) gasses in a ratio of $N_2O$: $SiH_2Cl_2$= 2:1. The depositions are accomplished at a temperature in the range of 600°–900° C. and a pressure in the range of 100–500 mTorr in the currently preferred embodiment. Also in the currently preferred embodiment, the composite oxide is subjected to an anneal in a nitrogen ambient at 1000° C. for thirty minutes. This anneal may be carried out in other inert gas ambients such as argon or helium. Additionally, the annealing ambient may be made partially oxidizing by adding approximately 1–5% oxygen, or by annealing in an ambient of $N_2O$. Oxide layer 38 is shown immediately after deposition in FIG. 5. Next, the oxide layer 38 will be masked and etched so that it is generally coincident with pad oxide layer 37.

Although the use of the composite oxide for the gate oxide layer is shown on an MOS device with conventional LOCOS isolation, and use of only the sub-100 Å oxide formed by the present invention is shown on an MOS device with advanced RESSFOX isolation, it will be appreciated that use of the sub-100 Å oxide formed by the present invention either alone or as part of a composite structure in any type of device will allow for the increased device reliability achieved by the oxide layer formed by the present invention.

Thus, the process for forming a reliable, low defect sub-100 Å oxide layer is shown. For oxides thicker than 100 Å, the use of a composite oxide is shown, wherein the sub-100 Å pad oxide is formed by the novel process described above, and the additional thickness is LPCVD deposited oxide.

We claim:

1. A process for forming an oxide layer on a semiconductor substrate comprising the steps of:

performing a first oxidation in a first mixture comprising oxygen and a chlorine containing compound, said mixture containing a sufficient amount of said chlorine containing compound such that chlorine exists in said mixture at a volume concentration greater than or equal to 9%; and performing a second oxidation in a second mixture comprising pyrogenic steam to form said oxide layer, said oxide layer being less than 100 Å in thickness.

2. The process as in claim 1 wherein the thickness of said oxide layer is less than 100 Å and wherein said first oxidation produces approximately 15–50 Å of the thickness of said oxide layer and said second oxidation produces approximately 25–65 Å of the thickness of said oxide layer.

3. The process as defined by claim 1 wherein said oxide layer is a first oxide layer of a composite oxide stack and wherein said process further comprises the step of depositing a second oxide layer on said first oxide layer by chemical vapor deposition to form said composite oxide stack comprising said first and said second oxide layers.

4. The process as defined by claim 3 wherein said first oxide layer has a thickness in the range of 40–90 Å and said second oxide layer has a thickness in the range of 60–200 Å.

5. The process as defined by claim 4 further comprising the step of annealing said composite oxide stack in an annealing ambient.

6. The process as defined by claim 1 wherein said chlorine containing compound comprises a substance selected from the group consisting of trichloroethane, trichloroethylene, chlorine, hydrogen chloride, or any combination thereof.

7. The process as defined by claim 1 wherein said first oxidation is performed at a temperature in the range of approximately 750°–900° C. and said second oxidation is performed at a temperature in the range of 750°–900° C.

8. The process as defined by claim 1 wherein said process is used in the formation of a semiconductor transistor, said semiconductor transistor having a gate oxide comprising said oxide layer.

9. The process as defined by claim 1 wherein said semiconductor substrate is subjected to a recessed field isolation process.

10. The process as defined by claim 8 wherein said semiconductor transistor is isolated by a recessed field isolation structure.

11. A process for forming an oxide layer on a semiconductor substrate comprising the steps of:

performing an initial oxidation in an initial mixture comprising an inert gas selected from the group consisting of nitrogen, argon, helium, or any combination thereof and approximately 1% oxygen;

performing a first oxidation in a first mixture comprising oxygen and a chlorine containing compound, said mixture containing a sufficient amount of said chlorine containing compound such that chlorine exists in said mixture at a volume concentration greater than or equal to 9%; and performing a second oxidation in a second mixture comprising pyrogenic steam to form said oxide layer, said oxide layer being less than 100 Å in thickness.

12. The process as defined by claim 11 wherein said initial oxidation produces approximately [5–20 ] *5–10* Å of the thickness of said oxide layer, said first oxidation produces approximately 15–50 Å of the thickness of said oxide layer and said second oxidation produces approximately 25–65 Å of the thickness of said oxide layer.

13. The process as defined by claim 11 wherein said chlorine containing compound comprises a substance selected from the group consisting of trichloroethane, trichloroethylene, chlorine, hydrogen chloride, or any combination thereof.

14. The process as defined by claim 11 wherein said first oxidation is performed at a temperature in the range of approximately 750°–900° C. and said second oxidation is performed at a temperature in the range of 750°–900° C.

15. The process as defined by claim 11 wherein said process is used in the formation of a semiconductor transistor, said semiconductor transistor having a gate oxide comprising said oxide layer.

16. The process as defined by claim 11 wherein said semiconductor substrate is subjected to a recessed field isolation process.

17. The process as defined by claim 15 wherein said semiconductor transistor is isolated by a recessed field isolation structure.

[18. A process for forming an oxide layer on a semiconductor substrate comprising the steps of:

pushing said substrate into a furnace while flowing a first gas mixture comprising an inert gas selected from the group consisting of nitrogen, argon, helium, or any combination thereof over said substrate;

ramping up the temperature of said furnace from a first temperature to a second temperature while flowing a second gas mixture comprising an inert gas selected from the group consisting of nitrogen, argon, helium, or any combination thereof over said substrate;

maintaining said second temperature while flowing a third gas mixture comprising an inert gas selected from the group consisting of nitrogen, argon, helium, or any combination thereof and approximately 1% oxygen over said substrate;

performing a first oxidation in a third gas mixture comprising oxygen and a chlorine containing compound; and performing a second oxidation in a fifth gas mixture comprising pyrogenic steam to form said oxide layer, said oxide layer being less than 100 Å in thickness.]

[19. The process as defined by claim 18 wherein the thickness of said oxide layer is less than 100 Å and wherein said first oxidation produces approximately 15–50 Å of the thickness of said oxide layer and said second oxidation produces approximately 25–65 Å of the thickness of said oxide layer.]

[20. The process as defined by claim 18 wherein said chlorine containing compound comprises a substance selected from the group consisting of trichloroethane, trichloroethylene, chlorine, hydrogen chloride, or any combination thereof.]

[21. The process as defined by claim 18 wherein said first oxidation is performed at a temperature in the range of approximately 750°–900° C. and said second oxidation is performed at a temperature in the range of 750°–900° C.]

[22. The process as defined by claim 18 wherein said process is used in the formation of a semiconductor transistor, said semiconductor transistor having a gate oxide comprising said oxide layer.]

[23. The process as defined by claim 18 wherein said semiconductor substrate is subjected to a recessed field isolation process.]

[24. The process as defined by claim 22 wherein said semiconductor transistor is isolated by a recessed field isolation structure.]

[25. The process as defined by claim 18 wherein the volume concentration of chlorine due to said chlorine containing compound is greater than or equal to 9%.]

[26. The process as defined by claim 18 wherein said chlorine containing compound comprises a substance selected from the group consisting of trichloroethane, trichloroethylene, chlorine, hydrogen chloride, or any combination thereof.]

[27. The process as defined by claim 18 wherein said second gas mixture further comprises approximately 1% oxygen.]

*28. A process for treating a semiconductor substrate comprising the steps of:*

*providing said semiconductor substrate;*

*placing said semiconductor substrate in a furnace; and*

*exposing said semiconductor substrate to an ambient, said ambient comprising a chlorine containing compound wherein the volume concentration of chlorine resulting from said chlorine containing compound is greater than or equal to 9%, said ambient oxidizing said semiconductor substrate to form an oxidized layer, wherein said substrate has a total oxide thickness of less than or equal to approximately 70 Å after said step of exposing said semiconductor substrate to said ambient.*

*29. A process for treating a semiconductor substrate comprising the steps of:*

*providing said semiconductor substrate;*

*placing said semiconductor substrate in a furnace;*

*exposing said semiconductor substrate to a first ambient, said first ambient comprising a chlorine containing compound wherein the volume concentration of chlorine resulting from said chlorine containing compound is greater than or equal to 9%, said first ambient oxidizing said semiconductor substrate to form an oxidized layer, wherein said substrate has a total oxide thickness of less than or equal to approximately 70 Å after said step of exposing said semiconductor substrate to said first ambient;*

*exposing said semiconductor substrate to a second ambient after exposing said substrate to said first ambient, said second ambient comprising $H_2O$; and*

*wherein said step of exposing said semiconductor substrate to said ambient is performed at a temperature of less than 900° C.*

*30. A process for treating a semiconductor substrate comprising the steps of:*

*providing said semiconductor substrate;*

*placing said semiconductor substrate in a furnace;*

*exposing said semiconductor substrate to an ambient, said first ambient comprising a chlorine containing compound wherein the volume concentration of chlorine resulting from said chlorine containing compound is greater than or equal to 9%, said first ambient oxidizing said semiconductor substrate to form an oxidized layer, wherein said oxidized layer has a thickness of less than or equal to approximately 70 Å after said step of exposing said semiconductor substrate to said first ambient;*

*exposing said semiconductor substrate to a second ambient after exposing to said substrate to said first ambient, said second ambient comprising $H_2O$;*

*wherein said step of exposing said semiconductor substrate to said ambient is performed at a temperature of less than 900° C.; and*

*wherein said step of exposing said semiconductor substrate to said ambient is performed at a temperature above 750° C.*

*31. The process as described in claim 28 wherein said first ambient is a dry ambient.*

*32. The process as described in claim 29 wherein said first ambient is a dry ambient.*

*33. The process as described in claim 28 wherein said first ambient comprises trichloroethane.*

*34. The process as described in claim 29 wherein said first ambient comprises trichloroethane.*

*35. The process as described in claim 31 wherein said first ambient comprises trichloroethane.*

*36. A process for treating a semiconductor substrate comprising the steps of:*

*providing said semiconductor substrate;*

*placing said semiconductor substrate in a furnace;*

*exposing said semiconductor substrate to an ambient, said ambient comprising a chlorine containing compound, said ambient oxidizing said semiconductor substrate to form an oxidized layer, wherein said oxidized layer has a thickness of less than or equal to approximately 70 Å after said step of exposing said semiconductor substrate to said ambient; and*

*exposing said semiconductor substrate to a second ambient, said second ambient comprising $H_2O$;*

*wherein the volume concentration of chlorine resulting from said chlorine containing compound is greater than or equal to 9%.*

*37. A process for treating a semiconductor substrate comprising the steps of:*

*providing said semiconductor substrate;*

*placing said semiconductor substrate in a furnace;*

*exposing said semiconductor substrate to an ambient, said ambient comprising a chlorine containing compound, said ambient oxidizing said semiconductor substrate to form an oxidized layer, wherein said oxidized layer has a thickness of less than or equal to approximately 70 Å after said step of exposing said semiconductor substrate to said ambient;*

*wherein said ambient comprises trichloroethane; and*

*wherein the volume concentration of chlorine resulting from said chlorine containing compound is greater than or equal to 9%.*

*38. A process for treating a semiconductor substrate comprising the steps of:*

*providing said semiconductor substrate;*

*placing said semiconductor substrate in a furnace;*

*exposing said semiconductor substrate to an ambient, said ambient comprising a chlorine containing compound, said ambient oxidizing said semiconductor substrate to form an oxidized layer, wherein said oxidized layer has a thickness of less than or equal to approximately 70 Å after said step of exposing said semiconductor substrate to said ambient;*

*wherein said step of exposing said semiconductor substrate to said ambient is performed at a temperature of less than 900° C.;*

*wherein said ambient comprises trichloroethane; and*

*wherein the volume concentration of chlorine resulting from said chlorine containing compound is greater than or equal to 9%.*

*39. A process for treating a semiconductor substrate comprising the steps of:*

*providing said semiconductor substrate;*

*placing said semiconductor substrate in a furnace;*

*exposing said semiconductor substrate to an ambient, said ambient comprising a chlorine containing compound, said ambient oxidizing said semiconductor substrate to form an oxidized layer, wherein said oxidized layer has a thickness of less than or equal to approximately 70 Å after said step of exposing said semiconductor substrate to said ambient;*

*wherein said ambient is a dry ambient;*

*wherein said ambient comprises trichloroethane; and*

*wherein the volume concentration of chlorine resulting from said chlorine containing compound is greater than or equal to 9%.*

*40. The process as described in claim 28 wherein an initial oxide layer is grown on said semiconductor substrate prior to said step of exposing said semiconductor substrate to said ambient.*

*41. The process as described in claim 39 wherein said initial oxide layer has a thickness and a range of approximately 5–10 Å.*

*42. A process for treating a semiconductor substrate comprising the steps of:*

*providing said semiconductor substrate;*

*placing said semiconductor substrate in a furnace;*

*exposing said semiconductor substrate to an ambient, said ambient comprising a chlorine containing compound, said ambient being a dry ambient, said ambient oxidizing said semiconductor substrate to form an oxidized layer, wherein said substrate comprises an oxide layer of approximately 5–10 Å prior to said step of exposing said semiconductor substrate to said ambient; and*

*wherein the volume concentration of chlorine resulting from said chlorine containing compound is greater than or equal to 9%.*

*43. The method as described in claim 42 wherein said step of exposing said semiconductor substrate to said ambient is performed at a temperature of less than 900° C.*

*44. The process as described in claim 43 wherein said step of exposing said semiconductor substrate to said ambient is performed at a temperature above 750° C.*

*45. The method as described in claim 42 wherein said ambient comprises trichloroethane.*

*46. The method as described in claim 43 wherein said ambient comprises trichloroethane.*

*47. A process for treating a semiconductor substrate comprising the steps of:*

*providing said semiconductor substrate;*

*placing said semiconductor substrate in a furnace;*

*exposing said semiconductor substrate to an ambient, said ambient comprising a chlorine containing compound, said ambient being a dry ambient, said ambient oxidizing said semiconductor substrate to form an oxidized layer, wherein said substrate comprises an oxide layer of approximately 5–10 Å prior to said step of exposing said semiconductor substrate to said ambient;*

*wherein said step of exposing said semiconductor substrate to said ambient is performed at a temperature of less than 900° C.; and*

*wherein the volume concentration of chlorine resulting from said chlorine containing compound is greater than or equal to 9%.*

*48. A process for treating a semiconductor substrate comprising the steps of:*

*providing said semiconductor substrate;*

*placing said semiconductor substrate in a furnace;*

*exposing said semiconductor substrate to an ambient, said ambient comprising a chlorine containing compound, said ambient being a dry ambient, said ambient oxidizing said semiconductor substrate to form an oxidized layer, wherein said substrate comprises an oxide layer of approximately 5–10 Å prior to said step of exposing said semiconductor substrate to said ambient;*

*wherein said ambient comprises trichloroethane; and*

*wherein the volume concentration of chlorine resulting from said chlorine containing compound is greater than or equal to 9%.*

*49. A process for treating a semiconductor substrate comprising the steps of:*

*providing said semiconductor substrate;*

*placing said semiconductor substrate in a furnace;*

*exposing said semiconductor substrate to an ambient, said ambient comprising a chlorine containing compound, said ambient being a dry ambient, said ambient oxidizing said semiconductor substrate to form an oxidized layer, wherein said substrate comprises an oxide layer of approximately 5–10 Å prior to said step of exposing said semiconductor substrate to said ambient;*

*wherein said step of exposing said semiconductor substrate to said ambient is performed at a temperature of less than 900° C.;*

*wherein said ambient comprises trichloroethane; and*

*wherein the volume concentration of chlorine resulting from said chlorine containing compound is greater than or equal to 9%.*

*50. A process for treating a semiconductor substrate comprising the steps of:*

*providing said semiconductor substrate;*

*placing said semiconductor substrate in a furnace;*

*exposing said semiconductor substrate to a first ambient, said first ambient comprising a chlorine containing compound, said ambient oxidizing said semiconductor substrate to form an oxidized layer, wherein said oxidized layer has a thickness of less than or equal to approximately 70 Å after said step of exposing said semiconductor substrate to said ambient;*

*exposing said semiconductor substrate to a second ambient, said second ambient after exposing said substrate to said first ambient comprising $H_2O$; and*

*wherein the volume concentration of chlorine resulting from said chlorine containing compound is greater than or equal to 9%.*

*51. The process of describing claim 50 wherein said step of exposing said semiconductor substrate to said first ambient is performed at a temperature of less than 900° C.*

*52. The process as described in claim 51 wherein said step of exposing said semiconductor substrate to said first ambient is performed at a temperature above 750° C.*

*53. A process for treating a semiconductor substrate comprising the steps of:*

*providing said semiconductor substrate;*

*placing said semiconductor said substrate in a furnace; and*

*exposing said semiconductor substrate to an ambient, said ambient comprising a chlorine containing compound, said ambient being a dry ambient, said ambient oxidizing said semiconductor substrate to form an oxidized layer, where is the substrate comprises an oxide layer of approximately 5–10 Å prior to said step of exposing said semiconductor substrate to said ambient, and wherein the volume concentration of chlorine resulting from said chlorine containing is greater than or equal to 9%.*

*54. A process for treating a semiconductor substrate comprising the steps of:*

*providing said semiconductor substrate;*

*exposing said semiconductor substrate to a first ambient, said first ambient comprising a chlorine containing compound wherein the volume concentration of chlorine resulting from said chlorine containing compound is greater than or equal to 9%, said first ambient oxidizing said semiconductor substrate to form a first oxidized layer having chlorine therein, said first oxide layer being less than 100 Å in thickness; and*

*exposing said semiconductor substrate to a second ambient after exposing said substrate to said first ambient, wherein said second ambient exposure removes substantially all of said chlorine from said first oxidized layer.*

* * * * *